United States Patent

Bolling

(10) Patent No.: US 9,596,289 B2
(45) Date of Patent: Mar. 14, 2017

(54) METHOD AND SYSTEM FOR COMPRESSION FOR ACARS AND RELATED TRANSMISSIONS

(71) Applicant: GE Aviation Systems LLC, Grand Rapids, MI (US)

(72) Inventor: Randy E. Bolling, Odessa, FL (US)

(73) Assignee: GE AVIATION SYSTEMS LLC, Grand Rapids, MI (US)

(*) Notice: Subject to any disclaimer, the term of this patent is extended or adjusted under 35 U.S.C. 154(b) by 169 days.

(21) Appl. No.: 14/535,152

(22) Filed: Nov. 6, 2014

(65) Prior Publication Data

US 2016/0134682 A1   May 12, 2016

(51) Int. Cl.
| | | |
|---|---|---|
| G06F 15/16 | (2006.01) | |
| G06F 15/173 | (2006.01) | |
| G06F 15/167 | (2006.01) | |
| H04L 29/08 | (2006.01) | |
| H04L 29/06 | (2006.01) | |
| H03M 7/30 | (2006.01) | |
| H04B 7/185 | (2006.01) | |
| H04W 4/20 | (2009.01) | |

(52) U.S. Cl.
CPC ............ *H04L 67/06* (2013.01); *H03M 7/30* (2013.01); *H03M 7/3084* (2013.01); *H03M 7/6064* (2013.01); *H04B 7/18506* (2013.01); *H04L 67/02* (2013.01); *H04L 67/10* (2013.01); *H04L 67/2823* (2013.01); *H04L 69/08* (2013.01); *H04W 4/20* (2013.01)

(58) Field of Classification Search
CPC ......... H04L 69/08; H04L 67/02; H04L 67/10; H04L 67/2823

USPC .......................... 709/224, 230, 219
See application file for complete search history.

(56) References Cited

U.S. PATENT DOCUMENTS

| | | | |
|---|---|---|---|
| 7,016,547 B1* | 3/2006 | Smirnov | H03M 7/40 375/E7.144 |
| 7,327,293 B2 | 2/2008 | Foster | |
| 7,719,441 B1* | 5/2010 | Dong | H03M 7/14 341/50 |
| 7,779,449 B2 | 8/2010 | Pham | |
| 2003/0030581 A1 | 2/2003 | Roy | |
| 2010/0074253 A1* | 3/2010 | Cheriyath | H04B 7/18506 370/389 |

(Continued)

FOREIGN PATENT DOCUMENTS

EP        2166677 A2    3/2010

OTHER PUBLICATIONS

Sharma, Compression Using Huffman Coding, 2010, pp. 133-141.*

(Continued)

*Primary Examiner* — Hieu Hoang
(74) *Attorney, Agent, or Firm* — GE Global Patent Operation; William S. Munnerlyn (57) ABSTRACT

A method of a method of communicating a data file over a radio frequency data link includes steps of determining a type of data represented in the data file; analyzing the data in the data file; selecting an encoding scheme from a plurality of encoding schemes and encoding one or more messages to represent the data file according to the selected encoding scheme. The one or more messages comply with a protocol for a character-oriented data link and the encoding losslessly compresses the data into the one or more messages.

13 Claims, 4 Drawing Sheets

(56) References Cited

U.S. PATENT DOCUMENTS

| | | | | |
|---|---|---|---|---|
| 2010/0220937 A1* | 9/2010 | Furbeck | ............... | H04N 19/147 |
| | | | | 382/246 |
| 2010/0293292 A1* | 11/2010 | Tamalet | ............. | H04B 7/18506 |
| | | | | 709/238 |
| 2011/0047281 A1* | 2/2011 | Gruyer | ............... | H04B 7/18506 |
| | | | | 709/230 |
| 2011/0099371 A1* | 4/2011 | Roy | ...................... | H04L 63/126 |
| | | | | 713/168 |
| 2011/0199243 A1 | 8/2011 | Fallon et al. | | |

OTHER PUBLICATIONS

Internet over the VDL-2 Subnetwork—the VDL-2/IP Aviation Datalink System, R.D. Grappel, Lincoln Laboratory Massachusetts Institute of Technology, Oct. 20, 2000.

Roy, "Secure Aircraft Communications Addressing and Reporting System (ACARS)", Institute of Electrical and Electronics Engineers, vol. No. 02, pp. 1-11, Oct. 14, 2001.

European Search Report and Opinion issued in connection with corresponding EP Application No. 15192970.0 on Apr. 5, 2016.

* cited by examiner

METHOD AND SYSTEM FOR COMPRESSION FOR ACARS AND RELATED TRANSMISSIONS

BACKGROUND OF THE INVENTION

Figure 1:
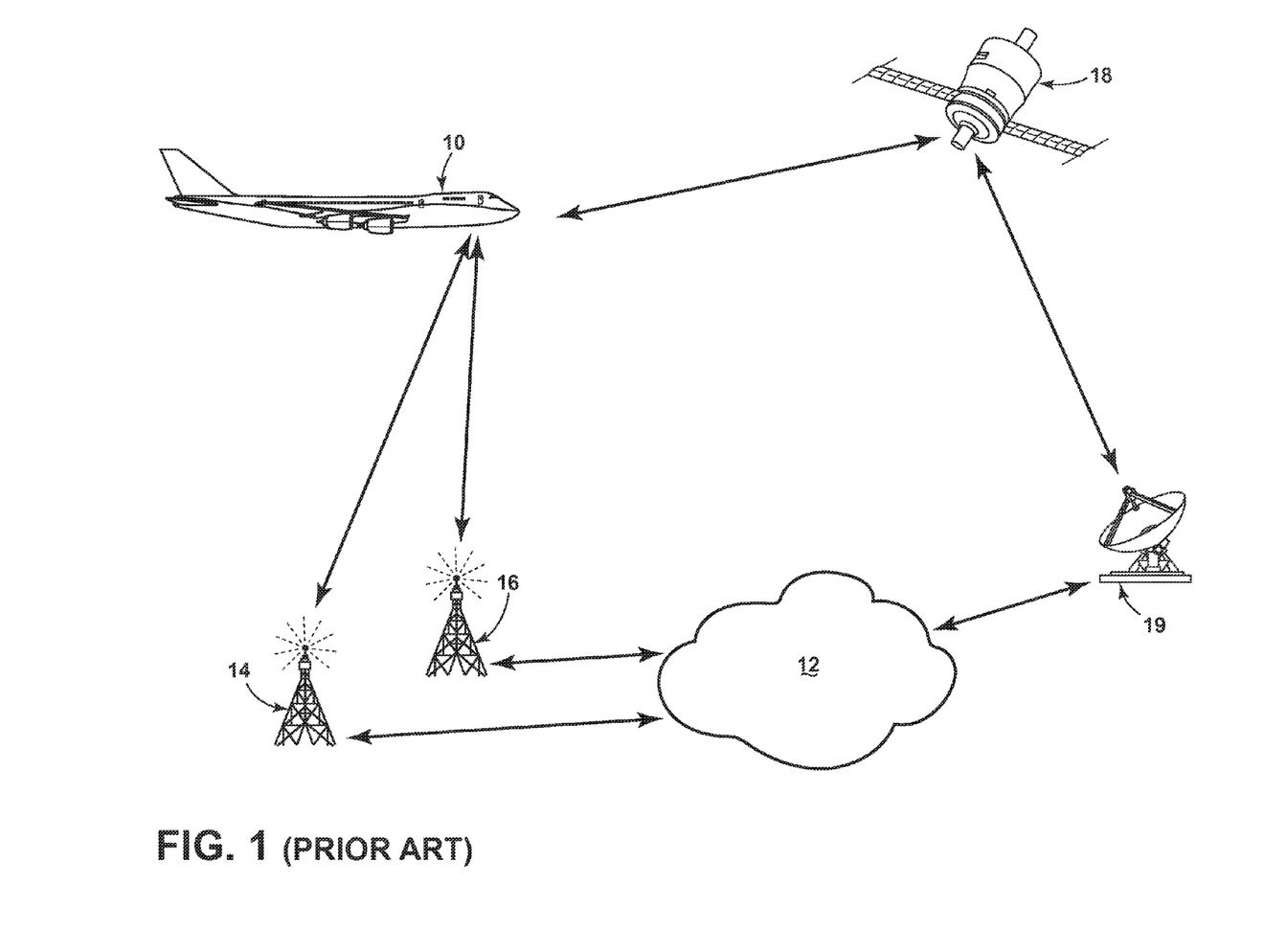
FIG. 1 is a prior art representation of a data link for aircraft-to-ground communications.

Airline Communications and Reporting System (ACARS) is a character-oriented radio frequency (RF) datalink system currently in use by airlines worldwide for a variety of Air Traffic Services (ATS), Airline Administrative Control (AAC), Aeronautical Operational Control (AOC), and Airline Passenger Communications (APC) datalink applications. ACARS employs a modulation scheme and media control protocol over open RF channels that achieve a raw throughput of 2,400 bits per second. As defined in the Aeronautical Radio, INCorporated (ARINC) 618-6 Air/Ground Character-Oriented Protocol Specification associated with ACARS, a set of American Standard Code for Information Interchange (ASCII) encoded characters may be transmitted over the system. As depicted in FIG. 1, transmission of data from an aircraft 10 to a ground network 12 typically involves an on-board Communications Management Unit (CMU) that automatically selects among transmission media including Very High Frequency (VHF) 14, High Frequency (HF) 16 and SATellite COMmunications (SATCOM) systems that include a satellite 18 and a satellite ground station 19. A CMU can alternatively be a function within a larger integrated system such as a combined Flight Management System that contains a CMU function or an Integrated Modular Avionics System with an included CMU function.

VHF Datalink Mode 2 (VDL-2) is a bit-oriented datalink system that provides high-speed, datalink functions over the same aviation VHF frequency spectrum currently supporting ACARS. VDL-2 achieves a raw data rate of 31,500 bits per second (i.e. a 13 times increase in throughput over the ACARS datalink). Via its datalink protocol, referred to as Aviation VHF Link Control (AVLC), VDL-2 provides for fully binary messages as opposed to the character-oriented ACARS.

Because VDL-2 operates in the same spectrum as ACARS at a much higher throughput, many experts in the airline industry view VDL-2 as the successor to ACARS. Even as the airline industry converts the existing ACARS systems into the faster VDL-2, VHF ground stations must support both ACARS and VDL-2 datalinks. During and after the transition, VDL-2 will include support for "legacy" ACARS applications for an extended period of time. To this end, a protocol referred to as ACARS over AVLC (AOA) defines a method of message encapsulation that enables the operation of ACARS applications over the VDL-2 datalink. The AOA protocol defines an AOA packet that encapsulates an ACARS message, which is further encapsulated into an AVLC frame. The AOA protocol differentiates AVLC frames containing AOA packets from other AVLC frames (such as AVLC containing ATN packets) with a 2-byte header where the first byte is known as the Initial Protocol Identifier (IPI) and the second byte is known as the Extended Protocol Identifier (EPI). The IPI and EPI may each be set with a preconfigured value to identify an encapsulated ACARS message. In operation, a Data Link Processor (DLP) at a VDL-2 AVLC interface identifies and directs encapsulated ACARS frames to the proper end-system.

In order to support modern bit-oriented applications over ACARS, ARINC developed a protocol (i.e. ARINC 622) that causes each 4-bit block of a binary data stream to be converted into a hexadecimal ACARS character. While the ARINC 622 protocol does provide a transition mechanism from existing ACARS systems to more modern binary aviation VHF datalinks, the ARINC 622 protocol results in a doubling of the message size because each 4 bits of binary data is encoded and transmitted as a one 8-bit ACARS character.

BRIEF DESCRIPTION OF THE INVENTION

One aspect of the invention relates to a method of communicating a data file over a radio frequency data link. The method comprises steps of determining a type of data represented in the data file; analyzing the data in the data file; selecting an encoding scheme from a plurality of encoding schemes and encoding one or more messages to represent the data file according to the selected encoding scheme. The one or more messages comply with a protocol for a character-oriented data link and the encoding losslessly compresses the data into the one or more messages.

Another aspect of the invention relates to a system to compress data of a data file for transmission on a radio frequency data link communication network. The system comprises an aircraft communications addressing and reporting system (ACARS) onboard an aircraft. The ACARS system is configured to determine a type of data represented in the data file; analyze the data in the data file; encode one or more messages to represent the data file; and tag the one or more messages to indicate the encoding. The system includes a compression database storing a plurality of encoding schemes. The onboard ACARS system selects one of the plurality of encoding schemes and losslessly compresses the data into the one or more messages.

DESCRIPTION OF EMBODIMENTS OF THE INVENTION

In the background and the following description, for the purposes of explanation, numerous specific details are set forth in order to provide a thorough understanding of the technology described herein. It will be evident to one skilled in the art, however, that the exemplary embodiments may be practiced without these specific details. In other instances, structures and devices are shown in diagram form in order to facilitate description of the exemplary embodiments.

The exemplary embodiments are described with reference to the drawings. These drawings illustrate certain details of specific embodiments that implement a module, method, or computer program product described herein. However, the drawings should not be construed as imposing any limitations that may be present in the drawings. The method and computer program product may be provided on any machine-readable media for accomplishing their operations. The embodiments may be implemented using an existing computer processor, or by a special purpose computer processor incorporated for this or another purpose, or by a hardwired system.

As noted above, embodiments described herein may include a computer program product comprising machine-readable media for carrying or having machine-executable instructions or data structures stored thereon. Such machine-readable media can be any available media, which can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium that can be used to carry or store desired program code in the form of machine-executable instructions or data structures and that can be accessed by a general purpose or special purpose computer or other machine with a processor. When information is transferred or provided over a network or another communication connection (either hardwired, wireless, or a combination of hardwired or wireless) to a machine, the machine properly views the connection as a machine-readable medium. Thus, any such a connection is properly termed a machine-readable medium. Combinations of the above are also included within the scope of machine-readable media. Machine-executable instructions comprise, for example, instructions and data, which cause a general purpose computer, special purpose computer, or special purpose processing machines to perform a certain function or group of functions.

Embodiments will be described in the general context of method steps that may be implemented in one embodiment by a program product including machine-executable instructions, such as program codes, for example, in the form of program modules executed by machines in networked environments. Generally, program modules include routines, programs, objects, components, data structures, etc., that have the technical effect of performing particular tasks or implement particular abstract data types. Machine-executable instructions, associated data structures, and program modules represent examples of program codes for executing steps of the method disclosed herein. The particular sequence of such executable instructions or associated data structures represent examples of corresponding acts for implementing the functions described in such steps.

Embodiments may be practiced in a networked environment using logical connections to one or more remote computers having processors. Logical connections may include a local area network (LAN) and a wide area network (WAN) that are presented here by way of example and not limitation. Such networking environments are commonplace in office-wide or enterprise-wide computer networks, intranets and the internet and may use a wide variety of different communication protocols. Those skilled in the art will appreciate that such network computing environments will typically encompass many types of computer system configurations, including personal computers, hand-held devices, multiprocessor systems, microprocessor-based or programmable consumer electronics, network PCs, mini-computers, mainframe computers, and the like.

Embodiments may also be practiced in distributed computing environments where tasks are performed by local and remote processing devices that are linked (either by hardwired links, wireless links, or by a combination of hardwired or wireless links) through a communication network. In a distributed computing environment, program modules may be located in both local and remote memory storage devices.

An exemplary system for implementing the overall or portions of the exemplary embodiments might include a general purpose computing device in the form of a computer, including a processing unit, a system memory, and a system bus, that couples various system components including the system memory to the processing unit. The system memory may include read only memory (ROM) and random access memory (RAM). The computer may also include a magnetic hard disk drive for reading from and writing to a magnetic hard disk, a magnetic disk drive for reading from or writing to a removable magnetic disk, and an optical disk drive for reading from or writing to a removable optical disk such as a CD-ROM or other optical media. The drives and their associated machine-readable media provide nonvolatile storage of machine-executable instructions, data structures, program modules and other data for the computer.

Figure 2:
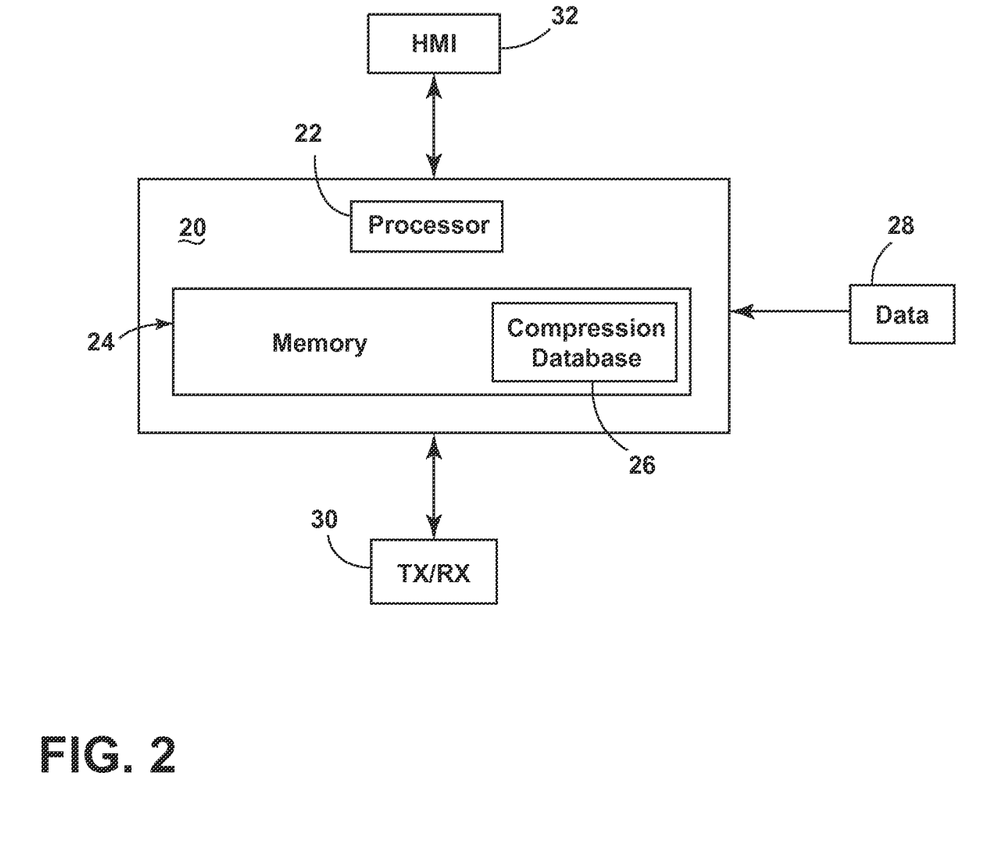
FIG. 2 is a block diagram depicting one embodiment of a communications system for use in a data link.

FIG. 2 is a block diagram depicting one embodiment of a communications system for use in a data link. A communication system implemented, in this exemplary embodiment, in an aircraft as part of an ACARS system may include a transceiver 30 for transmitting and receiving data over a data link. Although the transmitter and receiver are shown as an integrated transceiver in FIG. 2, in some implementations, the receiver and transmitter are separate devices. The system can include a management unit 20, which includes a processor 22 and a memory 24. The management unit 20 is coupled to at least one human-machine interface (HMI) device 32. The HMI device 32 may further comprise a display unit and an input unit for interfacing with a user, such as a pilot, of the communication system. For example, the HMI device 32 may provide commands to the management unit 20 from a user in operation of the aircraft.

The management unit 20, as marshaled by the processor 22, accepts data 28 from other devices including, but not limited to, sensors, actuators, compute nodes, etc. The data may include one or more files relating multimedia content where multimedia content includes text, imagery, video, audio, interactive, hypermedia, telephony and combinations thereof. For example, the management unit 20 may interface with a source of data that relays geographic or airport specific geospatial information to the cockpit as well data relating the status of aircraft systems and communications from ground control personnel or act as a web browser for the display of multimedia content.

The processor 22 can determine the type of data input to the management unit 20. Additionally, the processor 22 can analyze the particular data stream. In this way, the processor 22 determines characteristics both general to the type of input data (e.g. image data, audio data, telemetry etc.) and particular to the current input stream (i.e. the particular arrangement of the data stream bits or characters). The memory 24 includes a compression database 26 that maps data types and data streams to compression techniques and corresponding encoding schemes for compressing the data stream and encoding messages for transmission across the data link (with an associated data link protocol) by the transmitting portion of the transceiver 30. In this way, the communication system may transmit (and correspondingly receive) data with a character-oriented protocol such as provided by the ACARS network by compressing the data instead of increasing the number of transmitted characters.

Figure 3:
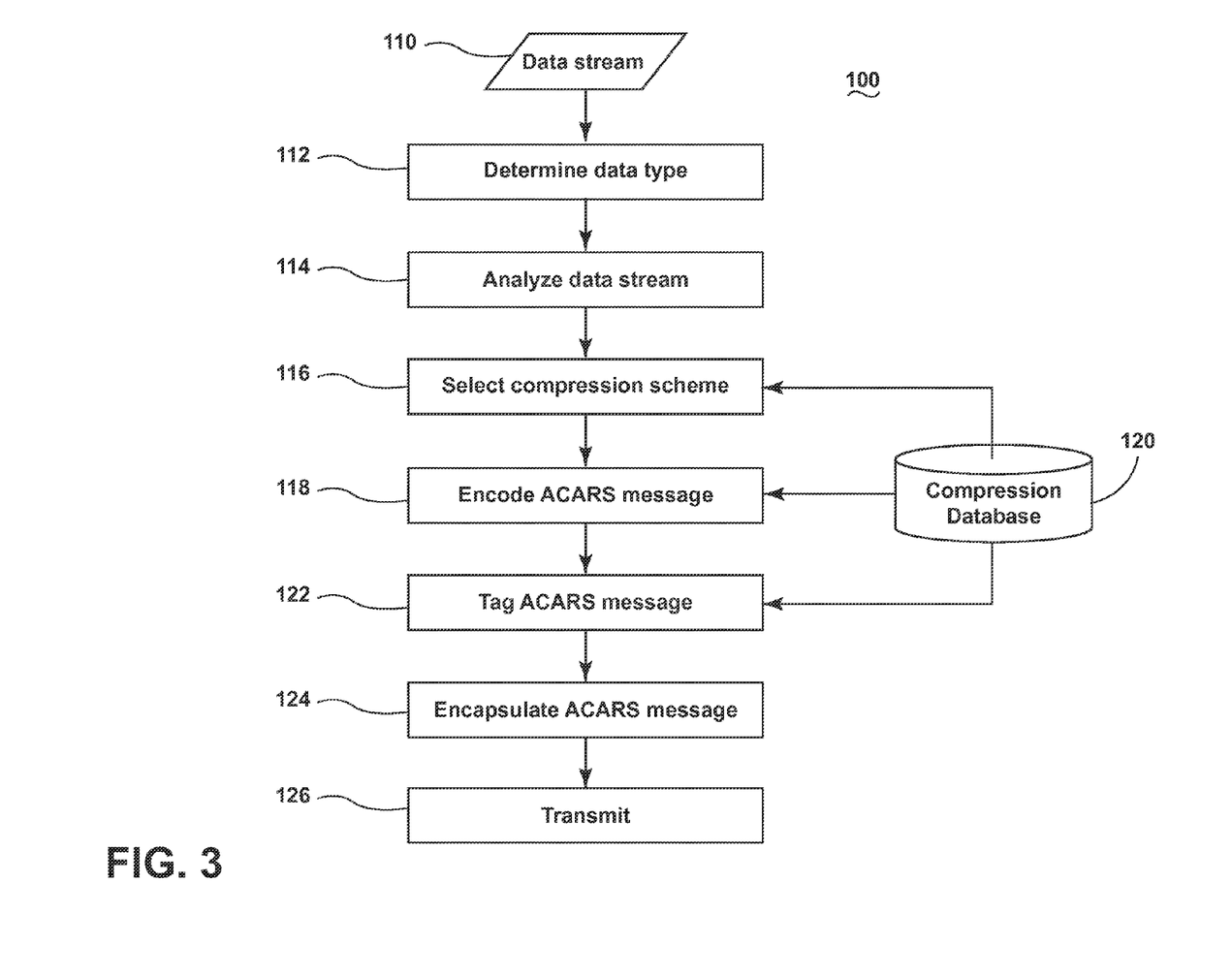
FIG. 3 is a flow chart depicting one embodiment of a method of encoding data for transmission over a data link.

Referring now to FIG. 3, a flow chart depicting one embodiment of a method 100 of encoding data for transmission over a data link is shown. A data stream 110 comprising one or more data files of multimedia data as defined above is input to the processor of the management unit. The processor determines the type of data in the data stream (or, equivalently, the data file at step 112). The processor analyzes the current data stream at step 114. The analysis may include, for example, categorizing the bit stream, determining probabilistic measures on either a character-oriented or a bit-oriented representation of the data stream or any of the many data analysis techniques known in information processing.

The processor may then select a compression scheme at step 116 by correlating the determined data type and data stream analysis with the compression database 120. By considering both the a priori information related to the type of data in the data file that originates the data stream and the in situ analysis of the instance of the data stream, the data may be dynamically compressible in ways heretofore not considered for aircraft data link applications. That is, in contrast to the known prior art where existing techniques for mapping binary data onto the character-oriented ACARS network increase the total number of transmitted characters, one embodiment of the method 100 compresses the data by considering the type and composition of the underlying data.

For example, consider the industry standard protocol ARINC 622 that doubles the size of the data for transmission by mapping each 4-bit data block to one 8-byte character. ARINC 622 includes the assumption that the entire incoming bit-stream may, with equal probability, be any of 2n possible values where n represents the logic grouping of the input stream. However, a particular data stream typically does not completely utilize the entire character space. That is, many data streams do not use every character available in the transmission protocol. In the case of an ACARS system, a data stream would need to use approximately 95 unique characters (i.e. ACARS encodes data to a subset of the ISO-5 character set) to span the entire character space. Furthermore, the standard message format for a transmitted ACARS message across the network contains a packet of just under 250 bytes dominated by 220 characters of text. Therefore, even when all 95 characters are used in the encoding process, the distribution of characters in the message is unlikely to be uniformly distributed. Furthermore, many data streams derive from a particular type of data file (e.g. HTML, XML, Portable Network Graphics, Comma Separated Value, etc.). The type of data file may inherently include biases and limitations that preclude encoding certain characters available in the ACARS protocol.

Because the character set for the 220 text items in ACARS is limited to approximately 95 characters, compression of the message using a run-length encode, Huffman encode, Lempel-Ziv-Welch encode or similar lossless compression method can reduce the total size of the ACARS message when it is routed over a multiple network layer protocol such as AOA. Customization of the compression scheme to the type and instance of the data stream further reduces the overall count and data size for transmission. The selected compression scheme at step 116 takes into account, by consideration of the compression database 120, the total number of unique symbols at the input and maps to grouped symbols (i.e. characters) at the output. In this way, the mapping allows character-based data streams to be efficiently transmitted over the ACARS network without the overhead of reserving symbols in the ACARS network for transmitting items that will not be utilized.

In the process of translating the input data stream 110 to a compressed output stream, two data streams that are already grouped based on a predefined character scheme are defined as sets X and Y. Each set represents a set of characters within the data stream. Based on the selected compression scheme from step 116, the processor may then map the input data stream 110 to an output data stream to form an encoded message at step 118. To achieve a mapping that is modifiable based on the data stream, the two transmission and receiving ends of the communication network must use the same encode/decode scheme. According to an embodiment of the method 100, the encoding scheme may be coordinated between nodes on the communication network in advance. Examples of encoding schemes built on advance knowledge include compression techniques determined by a priori knowledge of particular data types, the use of embedded table definitions or implementation of a defined start code that calls a predefined table set.

If the incoming data stream 110 contains n characters, the base of that stream is n while the output base is defined as m. The total number of possible values for a sequence of t characters is nt at the input and mt at the output. Optimal mapping occurs when an intermediate base, b, is determined as the Least Common Multiple (LCM) of m and n. Converting incoming sequence X from base n to base b and then mapping equal numbers of LCM characters to the output stream of base m results in a direct mapping of minimal overhead for transmission over the ACARS network.

Consider the incoming data stream as a set $X=\{x_0, x_1, x_2, x_3, x_4, x_5, x_6, x_7, x_8, \ldots, x_{n-1}\}$ consisting of n unique characters $x_0 \ldots x_{n-1}$, and the output data stream as a set $Y=\{y_0, y_1, y_2, y_3, y_4, y_5, y_6, y_7, y_8, \ldots, y_{m-1}\}$ consisting of m unique characters $y_0 \ldots y_{m-1}$. Comparing the number of elements of the incoming data stream and the output data stream yields three basic cases:

$$\langle n<m | n=m | n>m \rangle$$

The processor, based on the type of input data stream and the relationship of the data stream to the output data stream limited by the network protocol maps the set X to Y. The incoming data stream is not limited to be either a bit-stream or a character-stream while the output Y is limited by a character-oriented protocol.

Consider the case where n<m, e.g.:

$$X = \begin{cases} X_0 \\ X_1 \\ X_2 \\ X_3 \end{cases} \& Y = \begin{cases} Y_0 \\ Y_1 \\ Y_2 \\ Y_3 \\ Y_4 \end{cases}$$

yields the mapping $X_0 \Rightarrow Y_0$, $X_2 \Rightarrow Y_2$, $X_3 \Rightarrow Y_3$ with a leftover set of symbols in Y that are unused.

When n=m, the encoding degenerates to a one-to-one mapping between the input and output data streams.

Consider the case where n>m, e.g.:

$$X = \begin{cases} X_0 \\ X_1 \\ X_2 \\ X_3 \end{cases} \& Y = \begin{cases} Y_0 \\ Y_1 \\ Y_3 \end{cases}$$

yields, for example, the mapping $X_0 \Rightarrow Y_0 Y_0$, $X_1 \Rightarrow Y_0 Y_1$, $X_2 \Rightarrow Y_1 Y_0$ $X_3 \Rightarrow Y_1 Y_1$. When the number of symbols in X exceeds that in Y, more than a single output character will be required to complete the mapping. Using the LCM method, the mapping will be from a group of incoming characters to a group of outgoing characters. The group sizes will be defined as the Least Common Multiple of the two set sizes (i.e. the function LCM(n,m)). The mapping will define exactly $$\frac{LCM(n, m)}{n}$$

grouped symbols at the incoming stream mapped to $$\frac{LCM(n, m)}{m}$$

output symbols.

Therefore, in the case where n>m, the mapping is one input character to more than one output character. If $m<n/2^k$ for any positive integer k, the processor retrieves from the compression database 120 an encoding scheme that maps k+1 input characters or more to the output character as a straightforward mapping.

The processor may include a tag to indicate the selected compression used to encode the message at step 122. The tag may be an encoded header symbol in the message. The tag can enable context sensitive parsing to allow automatic decoding. In some embodiments, a processor may be able perform context sensitive parsing to automatically decode the compressed message without the inclusion of a tag.

In an operational environment method where a virtual network is operating within a second operational network such as running ACARS applications over the VDL-2 data link, the processor may encapsulate the message at step 124 within one or more multiple networks. Once flexibly mapped to the output character stream on ACARS, at step 126, the processor transmits the data over the data link that supports the ACARS data. The data link may be an ACARS system or a related data network.

Figure 4:
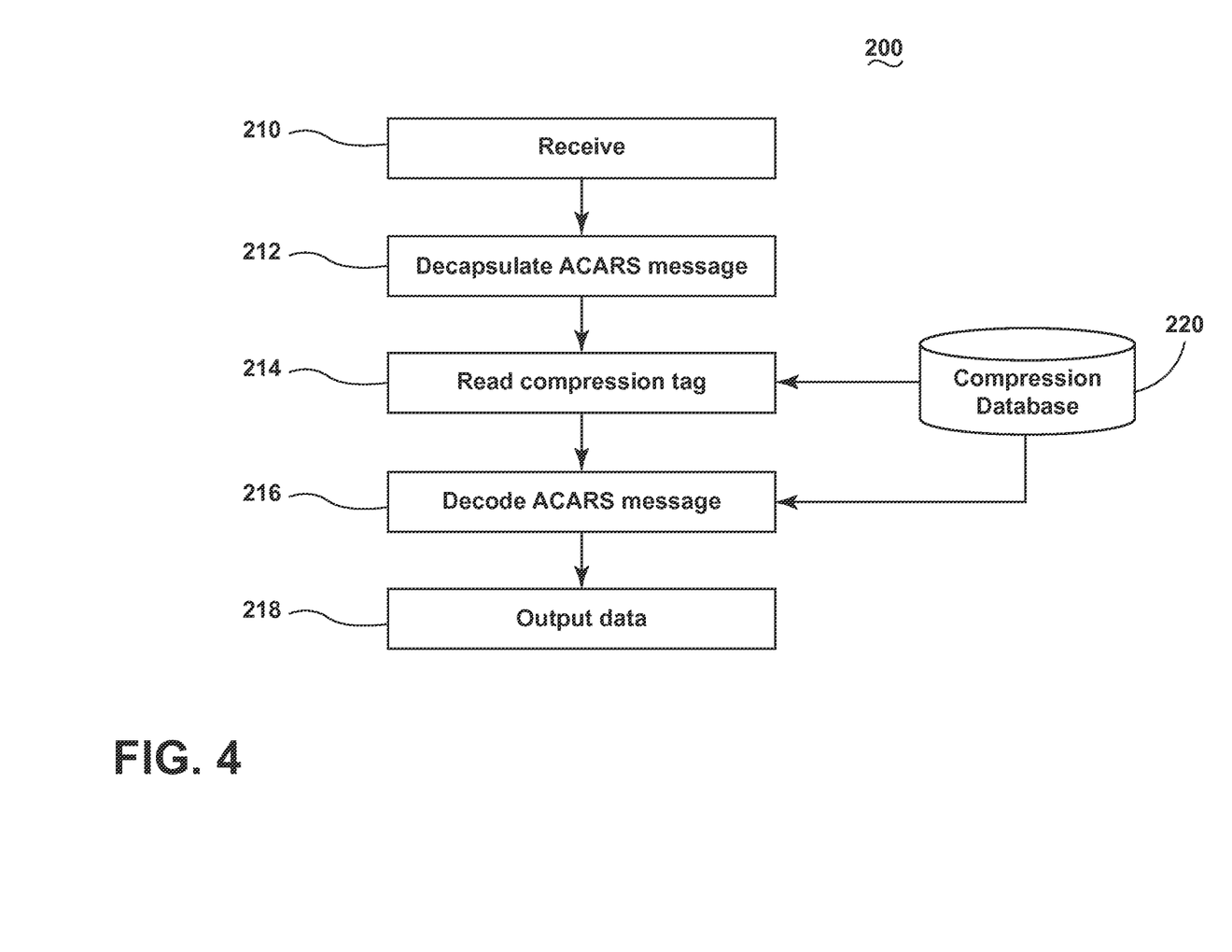
FIG. 4 is a flow chart depicting one embodiment of a method of decoding data received over a data link.

FIG. 4 is a flow chart depicting one embodiment of a method 200 of decoding data received over a data link. When a processor of a management unit receives a message across a data link at step 210, the processor may initially decapsulate the message if the message was encapsulated prior to transmission, as in the case where the message is transmitted within a network operating within a second operational network (e.g. AOA). If the message includes a tag designating the compression scheme, the processor reads the compression tag at step 214. The processor may then use the compression tag and the compression database 220 to decode the message at step 216. In this way, the processor inflates the compressed message to reform the data into the original data stream and, subsequently, the original data file. The processor may then direct the output data stream 218 or data file to the appropriate system connected to the management unit which may include an HMI or aircraft application.

Technical effects of embodiments of the system and method disclosed above include the reduction of overall bandwidth utilized in the ACARS or related transmission network (e.g. AOA) that results in a cost savings to airline operation centers.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of communicating a data file over an aircraft communications addressing and reporting system (ACARS), the method comprising:
   determining a type of data represented in the data file;
   analyzing data in the data file wherein the data has a data type of at least one of HTML, XML, Portable Network Graphics, or Comma Separated Value;
   selecting an encoding scheme from a plurality of encoding schemes based upon the type of data and the data in the data file;
   encoding one or more messages to represent the data file according to the selected encoding scheme, wherein the one or more messages comply with a protocol defined by ARINC 618 and the encoding losslessly compresses the data into the one or more messages;
   tagging the one or more messages to indicate the selected encoding scheme; and
   transmitting the one or more messages over the character-oriented data link.

2. The method of claim 1 wherein selecting the encoding scheme includes determining a number of available characters in the protocol defined by ARINC 618;
   determining a number of characters in the data file; and
   comparing the number of available characters in the protocol defined by ARINC 618 to the number of characters in the data file.

3. The method of claim 1 wherein the one or more messages are encapsulated in a second data link protocol.

4. The method of claim 3 wherein the second data link protocol is VDL-2.

5. The method of claim 3 wherein the second data link protocol is a multiple network layer protocol.

6. The method of claim 1 wherein the plurality of encoding schemes comprises a run-length encoder and a Huffman encoder.

7. The method of claim 1 wherein the plurality of encoding schemes are located in a compression database.

8. The method of claim 1 wherein the tagging comprises including an encoded header symbol in the one or more messages.

9. A system to compress data of a data file for transmission on a radio frequency data link communication network, the system comprising:
   an aircraft communications addressing and reporting system (ACARS) onboard an aircraft, the ACARS configured to:
      determine a type of data represented in the data file wherein the type of data is at least one of of HTML, XML, Portable Network Graphics, or Comma Separated Value;
      analyze data in the data file;
      encode one or more messages to represent the data file; and
      tag the one or more messages to indicate the encoding and
   a compression database storing a plurality of encoding schemes;
      wherein the ACARS selects one of the plurality of encoding schemes, losslessly compresses the data into the one or more messages, and transmits the one or more messages over a data link defined by ARINC 618.

10. The system of claim 9 wherein the compression database storing a plurality of encoding schemes indexes the schemes based upon a type of data.

11. The system of claim 9 wherein the radio frequency data link is VDL-2.

12. The system of claim 9 wherein the ACARS further includes a processor.

13. The system of claim 12 wherein the compression database is located in memory accessible by the processor.

\* \* \* \* \*